United States Patent
Tsai et al.

(10) Patent No.: US 10,080,309 B2
(45) Date of Patent: Sep. 18, 2018

(54) ELECTRONIC SYSTEM AND EXTERNAL AUXILIARY HEAT DISSIPATION DEVICE THEREOF

(71) Applicant: COOLER MASTER CO., LTD., New Taipei (TW)

(72) Inventors: Shui-Fa Tsai, New Taipei (TW); Shih-Wei Huang, New Taipei (TW); Hsin-Hung Chen, New Taipei (TW)

(73) Assignee: Cooler Master Co., Ltd., New Taipei (TW)

( * ) Notice: Subject to any disclaimer, the term of this patent is extended or adjusted under 35 U.S.C. 154(b) by 327 days.

(21) Appl. No.: 14/963,780

(22) Filed: Dec. 9, 2015

(65) Prior Publication Data

US 2017/0079161 A1    Mar. 16, 2017

(30) Foreign Application Priority Data

Sep. 10, 2015  (CN) .......................... 2015 1 0573556

(51) Int. Cl.
  *H05K 7/20*  (2006.01)
  *G06F 1/16*  (2006.01)
  *G06F 1/20*  (2006.01)

(52) U.S. Cl.
  CPC ....... *H05K 7/20263* (2013.01); *G06F 1/1632* (2013.01); *G06F 1/20* (2013.01); *H05K 7/20272* (2013.01)

(58) Field of Classification Search
  CPC ........... H05K 7/20627; H05K 7/20263; H05K 7/20763; H05K 7/20272; G06F 1/1632; G06F 1/20

See application file for complete search history.

(56) References Cited

U.S. PATENT DOCUMENTS 3,673,541 A * 6/1972 Volinskie ................ F16L 25/01
                                                              285/119
3,777,298 A * 12/1973 Newman ................ B23K 9/323
                                                              439/191

(Continued)

FOREIGN PATENT DOCUMENTS

TW         I411390 B     10/2013
TW         I431737 B      3/2014

(Continued)

*Primary Examiner* — James Wu
*Assistant Examiner* — Michael Matey
(74) *Attorney, Agent, or Firm* — Muncy, Geissler, Olds & Lowe, P.C.

(57) ABSTRACT

An external auxiliary heat dissipation device includes an external connection head module, a fluid driving module, a heat dissipation module, and a plurality of first pipes. The external connection head module includes a first carrier body and at least two first fluid connection disposed on the first carrier body. The first pipes connect to the first fluid connection head, the fluid driving module, and the heat dissipation module to form a first fluid pathway. The electronic system includes an internal connection head module and a plurality of second pipes. The second pipes connect to the internal connection head module to form a second fluid pathway. The internal connection head module is detachably connected to the external connection head module, so that the first and the second fluid pathways are in fluid communication with each other to form a loop fluid pathway.

16 Claims, 20 Drawing Sheets

(56) References Cited

U.S. PATENT DOCUMENTS

| | | | | |
|---|---|---|---|---|
| 4,507,707 A * | 3/1985 | Willis | ............... | F15B 13/0814 |
| | | | | 137/884 |
| 4,913,189 A * | 4/1990 | Kline | ............... | B60H 1/00642 |
| | | | | 137/560 |
| 5,234,032 A * | 8/1993 | Kline | ............... | B60H 1/00642 |
| | | | | 137/884 |
| 5,637,006 A * | 6/1997 | Almeras | ............ | H01R 13/005 |
| | | | | 439/191 |
| 6,450,202 B2 * | 9/2002 | Bogdanowicz | ..... | F15B 13/0402 |
| | | | | 137/625.64 |
| 6,598,279 B1 * | 7/2003 | Morgan | ............ | H01R 13/005 |
| | | | | 285/26 |
| 6,799,605 B1 * | 10/2004 | Van Scyoc | ........ | F16L 37/56 |
| | | | | 137/594 |
| 7,069,737 B2 | 7/2006 | Wang et al. | | |
| 7,465,177 B2 * | 12/2008 | Wood | ............... | H01R 13/005 |
| | | | | 439/191 |
| 8,631,860 B2 | 1/2014 | Tang et al. | | |
| 2004/0008483 A1 * | 1/2004 | Cheon | ............... | G06F 1/20 |
| | | | | 361/679.53 |
| 2005/0141196 A1 | 6/2005 | Yamatani et al. | | |
| 2005/0161197 A1 * | 7/2005 | Rapaich | ............ | G06F 1/1632 |
| | | | | 165/80.4 |
| 2005/0219471 A1 | 10/2005 | Kitabayashi | | |
| 2007/0097641 A1 | 5/2007 | Walters et al. | | |
| 2010/0259886 A1 | 10/2010 | Mongia | | |
| 2011/0006771 A1 * | 1/2011 | Randell | ............ | G01R 33/3403 |
| | | | | 324/318 |
| 2011/0170895 A1 | 7/2011 | Fujiya et al. | | |
| 2012/0145360 A1 * | 6/2012 | Tang | ............... | H05K 7/20272 |
| | | | | 165/104.33 |
| 2014/0198434 A1 * | 7/2014 | Ho | ............... | G06F 1/16 |
| | | | | 361/679.01 |
| 2014/0246174 A1 * | 9/2014 | Arvelo | ............ | F28F 1/00 |
| | | | | 165/104.11 |
| 2015/0010030 A1 | 1/2015 | Hirota | | |

FOREIGN PATENT DOCUMENTS

| | | |
|---|---|---|
| TW | M508055 U | 9/2015 |
| TW | M516180 U | 1/2016 |

* cited by examiner

ELECTRONIC SYSTEM AND EXTERNAL AUXILIARY HEAT DISSIPATION DEVICE THEREOF

BACKGROUND OF THE INVENTION

1. Field of the Invention

The instant disclosure relates to an electronic system and an auxiliary heat dissipation device thereof, and more particularly to an electronic system and an external auxiliary heat dissipation device thereof.

2. Description of Related Art

A water block heat-dissipating structure includes a seat body and a seal cover body. The seat body has a plurality of heat-dissipating fins formed thereon, and a bottom portion of the seat body contacting a heat-generating source. In addition, the seal cover body is used to seal and cover the seat body. The seal cover body further has a water inlet and a water outlet. When the bottom portion of the seat body contacts a heat-generating source, heat is transmitted from the heat-generating source to the heat-dissipating fins. In addition, the heat of the first heat-dissipating fins can be guided away quickly by cooling liquids that circulate between the water inlet and the water outlet.

SUMMARY OF THE INVENTION

One aspect of the instant disclosure relates to an electronic system and an external auxiliary heat dissipation device thereof.

One of the embodiments of the instant disclosure provides an electronic system, comprising: an external auxiliary heat dissipation device and an electronic device. The external auxiliary heat dissipation device comprises an external connection head module, a fluid driving module, a heat dissipation module, and a plurality of first pipes. The external connection head module includes a first carrier body and at least two first fluid connectors disposed on the first carrier body. The first pipes are connected to the first fluid connector, the fluid driving module, and the heat dissipation module to form a first fluid pathway. The electronic device includes an internal connection head module and a plurality of second pipes. The second pipes are connected to the internal connection head module to form a second fluid pathway, and the internal connection head module is detachably connected to the external connection head module, so that the first fluid pathway and the second fluid pathway are in fluid communication with each other to form a loop fluid pathway.

Another one of the embodiments of the instant disclosure provides an external auxiliary heat dissipation device, comprising: an external connection head module, a fluid driving module, a heat dissipation module, and a plurality of first pipes. The external connection head module includes a first carrier body and at least two first fluid connectors disposed on the first carrier body. The first pipes are connected to the first fluid connector, the fluid driving module, and the heat dissipation module to form a first fluid pathway. the title as it appears on the first page of the specification and in the U.S. Patent and Trademark Office records, as follows:

Therefore, when the internal connection head module is detachably connected to the external connection head module, the first fluid pathway and the second fluid pathway are in fluid communication with each other to form a loop fluid pathway due to the design of "the first pipes being connected to the first fluid connector, the fluid driving module, and the heat dissipation module to form a first fluid pathway" and "the second pipes being connected to the internal connection head module to form a second fluid pathway".

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

The embodiments of "the electronic system and the external auxiliary heat dissipation device thereof" of the instant disclosure are described. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

Figure 1:
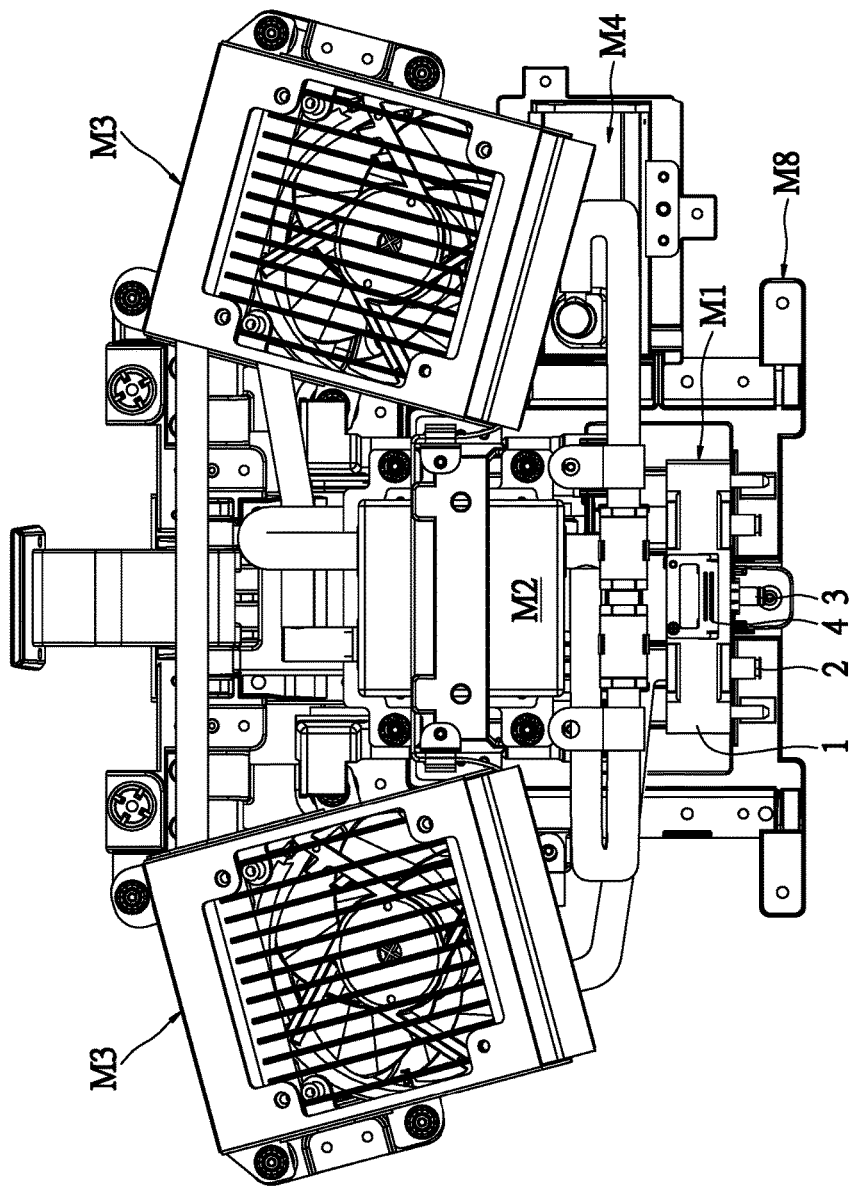
FIG. 1 shows a top, schematic view of the external auxiliary heat dissipation device according to the instant disclosure.
Figure 2:
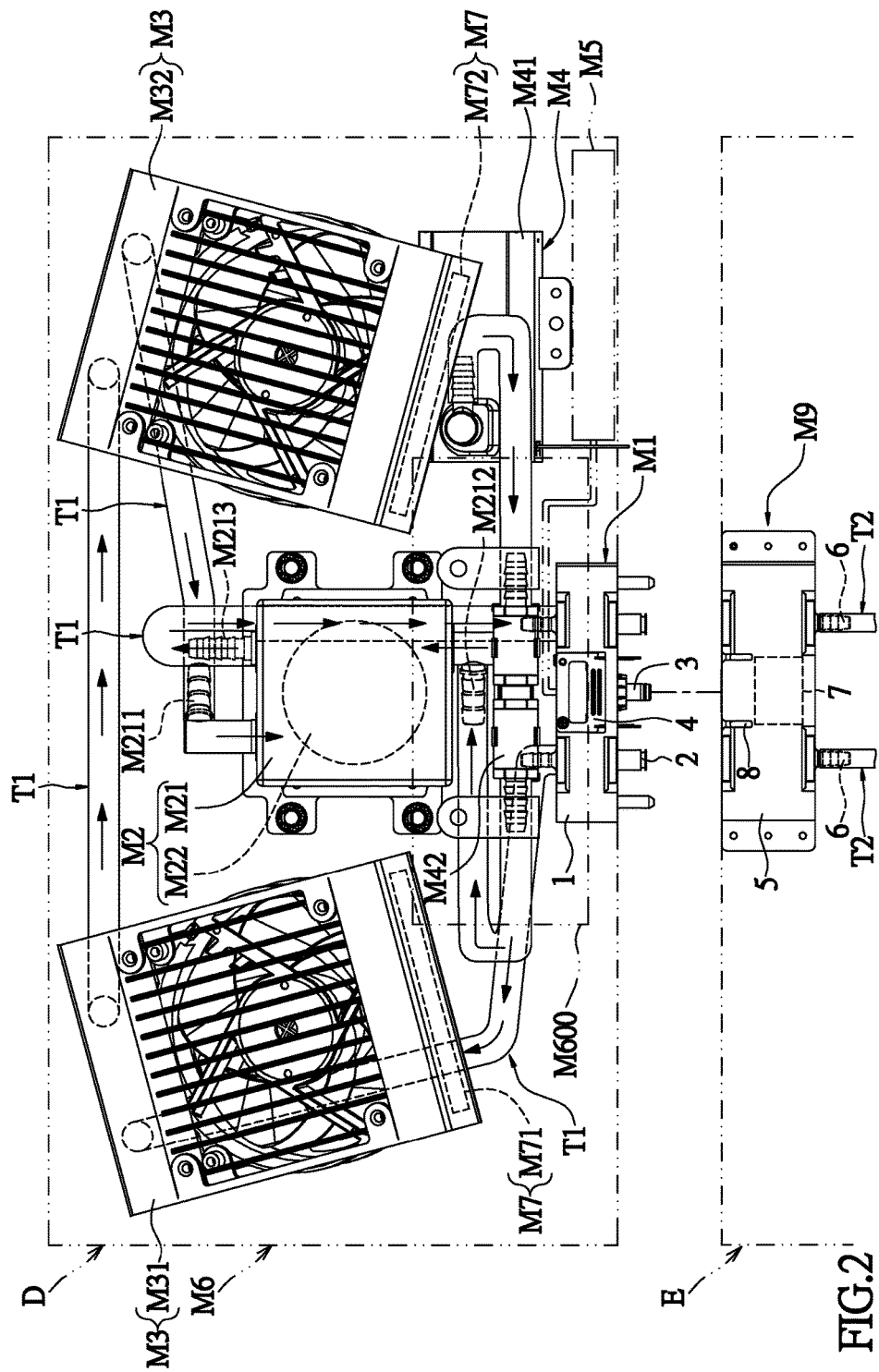
FIG. 2 shows a top, schematic view of the electronic system without the carrier module according to the instant disclosure.

Referring to FIG. 1 to FIG. 5, the instant disclosure provides an electronic system S, comprising an external auxiliary heat dissipation device D and electronic device E, and the arrows shown in FIG. 2 mean flow direction of fluid.

First, referring to FIG. 1 and FIG. 2, the external auxiliary heat dissipation device D includes an external connection head module M1, a fluid driving module M2, a heat dissipation module M3, and a plurality of first pipes T1. The external connection head module M1 includes a first carrier body 1, at least two first fluid connectors 2 disposed on the first carrier body 1, and the first pipes T1 are connected to the first fluid connector 2, the fluid driving module M2, and the heat dissipation module M3 to form a first fluid pathway.

More particularly, the at least two first fluid connectors 2 can pass through the first carrier body 1, and the external connection head module M1 includes a first power connector 3 disposed on the first carrier body 1 (for example, the first power connector passes through the first carrier body 1), and at least one first retaining body 4 disposed on the first carrier body 1. In addition, the fluid driving module M2 is in fluid communication with one of the at least two first fluid connectors 2 through the first pipe T1, and the heat dissipation module M3 is in fluid communication between another one of the at least two first fluid connectors 2 and the fluid driving module M2 through the first pipe T1.

Figure 3:
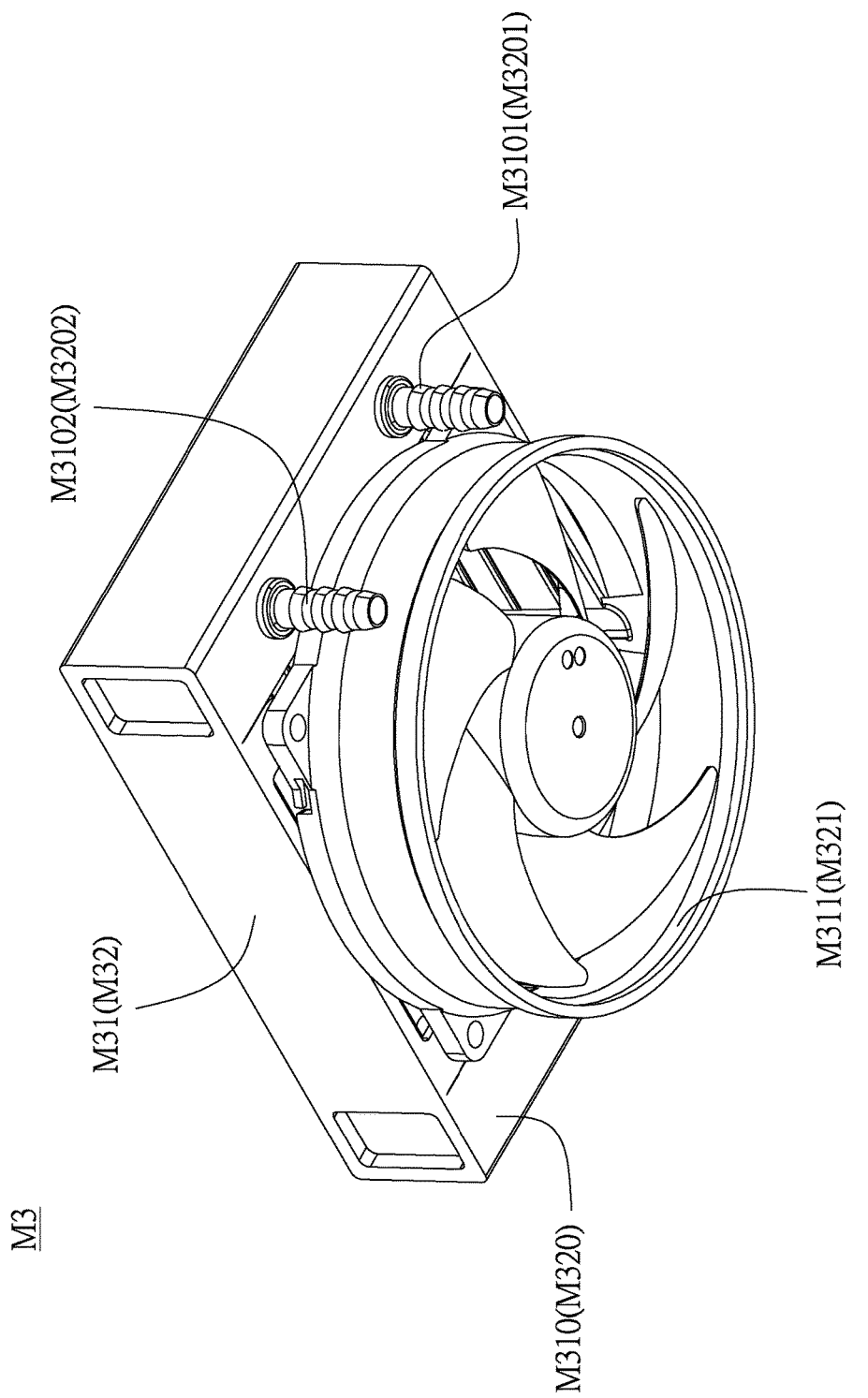
FIG. 3 shows a perspective, schematic view of the heat dissipation module of the external auxiliary heat dissipation device according to the instant disclosure.

Following the above description, referring to FIG. 2 and FIG. 3, the heat dissipation module M3 includes a first water-cooling heat dissipation structure M31 in fluid communication with one of the two first fluid connectors 2 through the first pipe T1 and a second water-cooling heat dissipation structure M32 in fluid communication with the first water-cooling heat dissipation structure M31 through the first pipe T1, and the first water-cooling heat dissipation structure M31 and the second water-cooling heat dissipation structure M32 are symmetrically arranged relative to the fluid driving module M2. For example, the first water-cooling heat dissipation structure M31 includes a first water-cooling heat sink M310 and a first heat-dissipating fan M311 disposed on the bottom side of the first water-cooling heat sink M310, and the first water-cooling heat sink M310 has a first water inlet M3101 and a first water outlet M3102. In addition, the second water-cooling heat dissipation structure M32 includes a second water-cooling heat sink M320 and a second heat-dissipating fan M321 disposed on the bottom side of the second water-cooling heat sink M320, and the second water-cooling heat sink M320 has a second water inlet M3201 and a second water outlet M3202.

Furthermore, referring to FIG. 1 and FIG. 2, the electronic device E includes an internal connection head module M9 detachably connected to the external connection head module M1. More particularly, the internal connection head module M9 includes a second carrier body 5 detachably connected with the first carrier body 1, at least two second fluid connectors 6 disposed on (such as passing through) the second carrier body 5 and respectively detachably connected with the at least two first fluid connectors 2, a second power connector 7 disposed on (such as passing through) the second carrier body 5 and detachably electrically connected between the first power connector 3 and the electronic device E, and a second retaining body 8 disposed on the second carrier body 5 and detachably mated with the first retaining body 4.

More particularly, as shown in FIG. 2, the electronic device E further includes a plurality of second pipes T2 arranged inside the electronic device E, and two of the second pipes T2 are respectively connected to the at least two second fluid connectors 6. In addition, the second pipes T2 are connected to the internal connection head module M9 to form a second fluid pathway. Therefore, the internal connection head module M9 is detachably connected to the external connection head module M1, so that the first fluid pathway and the second fluid pathway are in fluid communication with each other to form a loop fluid pathway (such as a closed loop fluid pathway). In other words, when the fluid driving module M2 is driven, the heat generated by the electronic device E is transmitted from the first fluid pathway (that is formed by connecting the first pipes T1, the first fluid connector 2, the fluid driving module M2, and the heat dissipation module M3) to the second fluid pathway (that is formed by connecting the second pipes T2 and the internal connection head module M9), so that the heat generated by the electronic device E can be dissipated by the loop fluid pathway that is formed by matching the first fluid pathway and the second fluid pathway.

More particularly, referring to FIG. 1 and FIG. 2, the external auxiliary heat dissipation device D further comprises a fluid supply module M4, and the fluid supply module M4 includes a replaceable fluid supply cartridge M41 and a quick-release connector M42 in fluid communication with the replaceable fluid supply cartridge M41 through the first pipe T1. Therefore, when heat-dissipating liquids inside the external auxiliary heat dissipation device D is not enough, heat-dissipating liquids of the external auxiliary heat dissipation device D can be replenished by the replaceable fluid supply cartridge M41. Please note, referring to FIG. 2 and FIG. 3, the fluid driving module M2 includes an outer casing M21 and a pump M22 disposed inside the outer casing M21, and the outer casing M21 has a first water inlet M211 in fluid communication with the second water-cooling heat dissipation structure M32 through the first pipe T1, a second water inlet M212 in fluid communication with the quick-release connector M42 through the first pipe T1, and a water outlet M213 in fluid communication with another one of the two first fluid connectors 2 through the first pipe T1.

More particularly, as shown in FIG. 2, the external auxiliary heat dissipation device D further comprises a power supply module M5 electrically connected to the first power connector 3, so that the power supply module M5

(such as rechargeable battery) can be used as a power source for the electronic device E. However, the power supply module M5 is merely an example and is not meant to limit the instant disclosure, for example, the first power connector 3 may be electrically connected to a socket with commercial power through a power line.

More particularly, as shown in FIG. 2, the external auxiliary heat dissipation device D further comprises a casing module M6 and a light-emitting module M7. The casing module M6 has a transparent viewing window M600. The light-emitting module M7 includes a first LED light-emitting group M71 and a second LED light-emitting group M72 respectively disposed on the first water-cooling heat dissipation structure M31 and the second water-cooling heat dissipation structure M32 of the heat dissipation module M3, and light beams generated by the light-emitting module M7 can pass through the transparent viewing window M600 and go away from the transparent viewing window M600.

Figure 4:
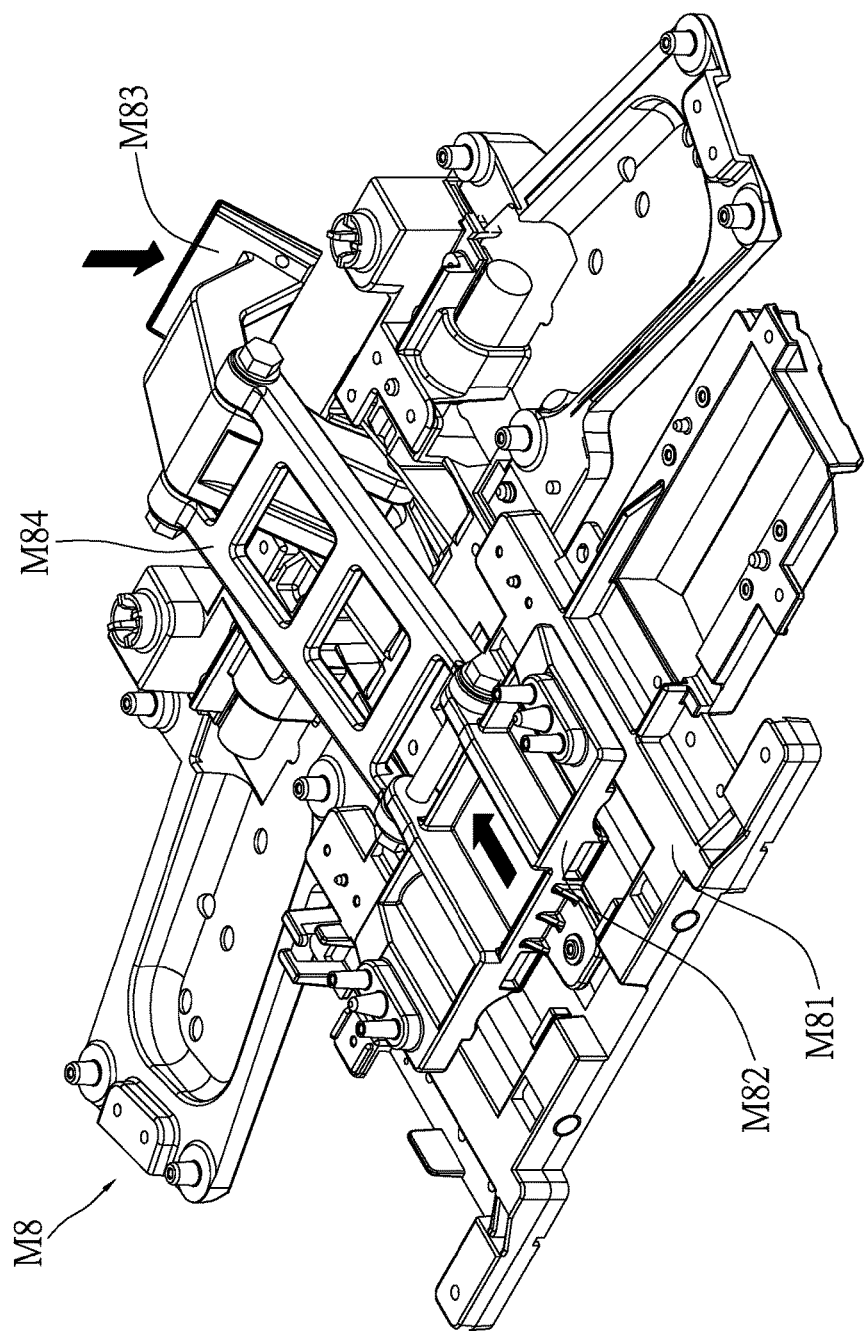
FIG. 4 shows a perspective, schematic view of the external connection head module of the external auxiliary heat dissipation device moved backward to a first predetermined position by the carrier module according to the instant disclosure.
Figure 5:
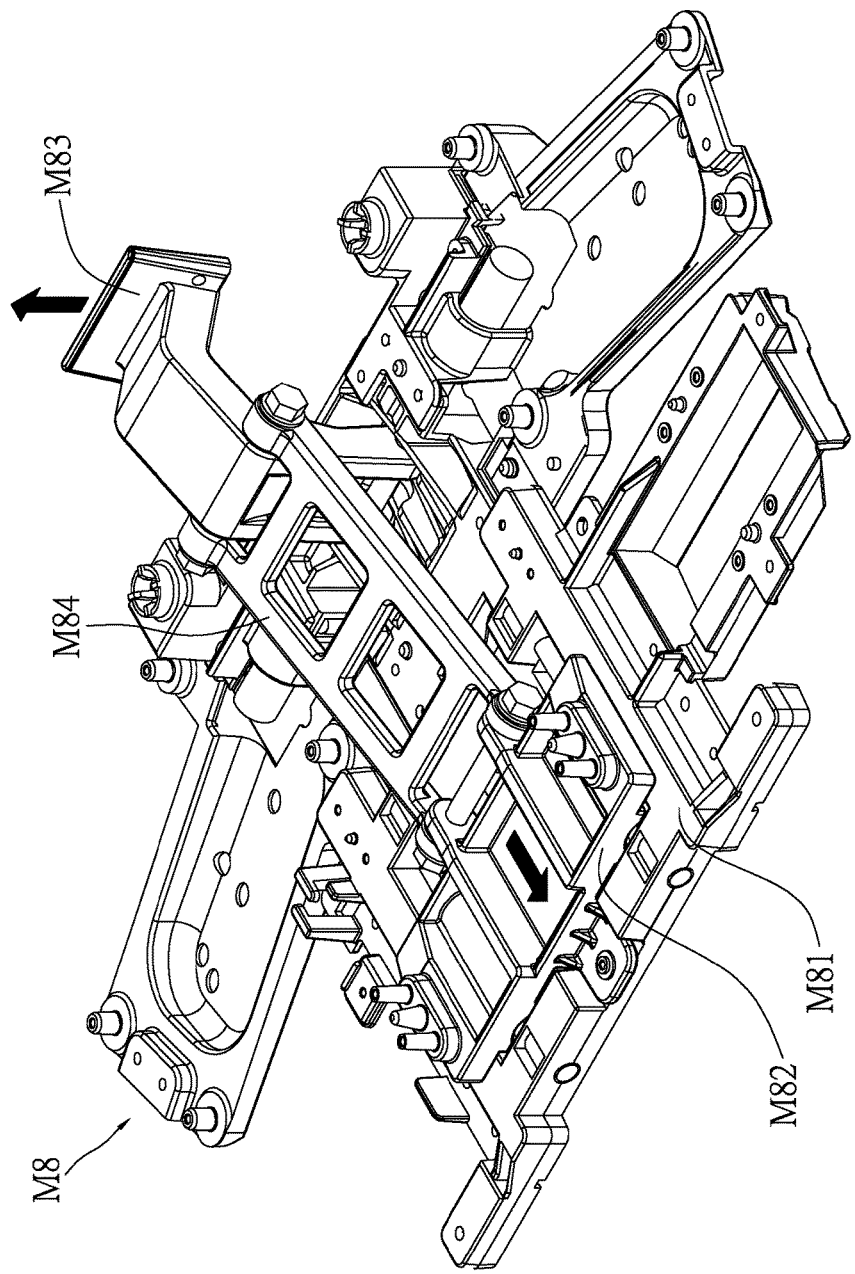
FIG. 5 shows a perspective, schematic view of the external connection head module of the external auxiliary heat dissipation device moved frontward to a second predetermined position by the carrier module according to the instant disclosure.
Figure 6:
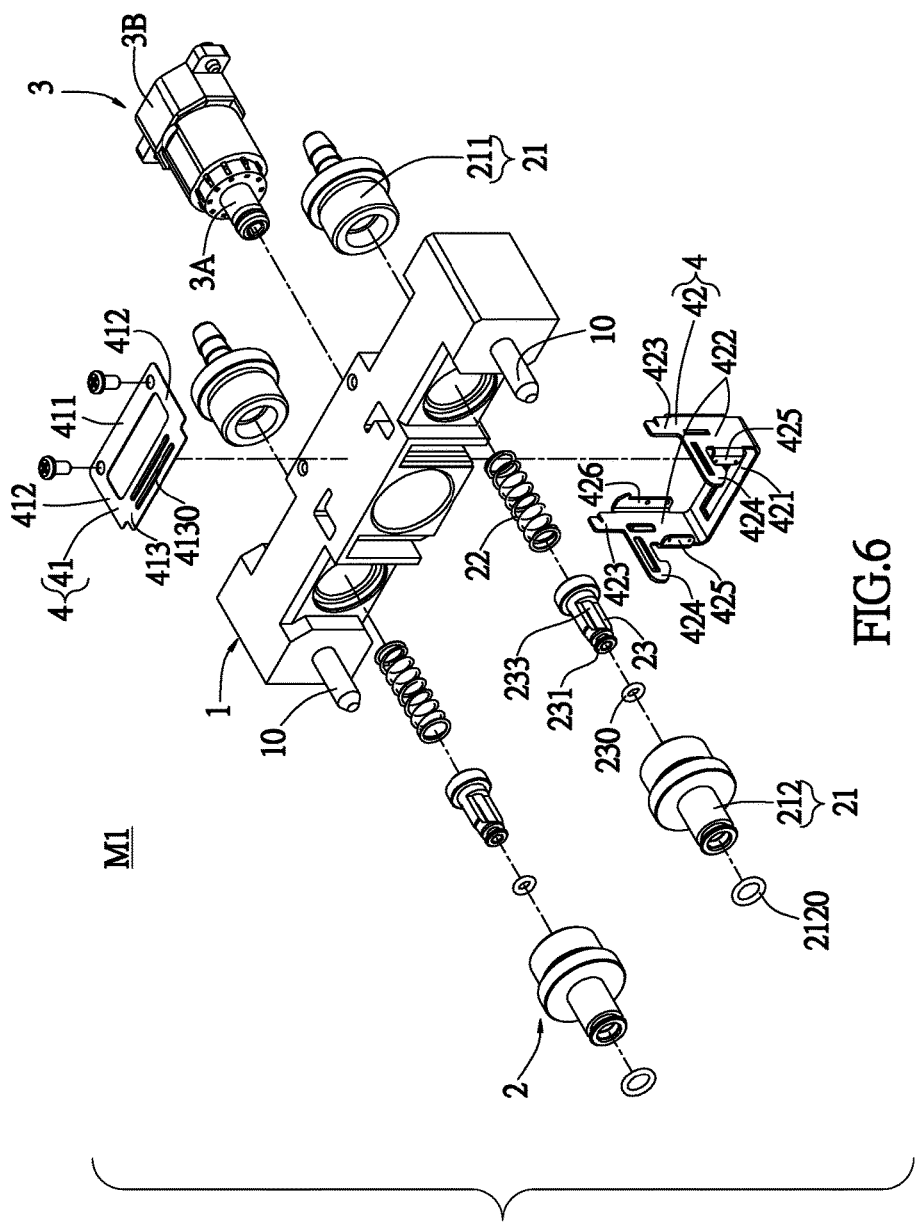
FIG. 6 shows a perspective, exploded, schematic view of the external connection head module according to the instant disclosure.
Figure 7:
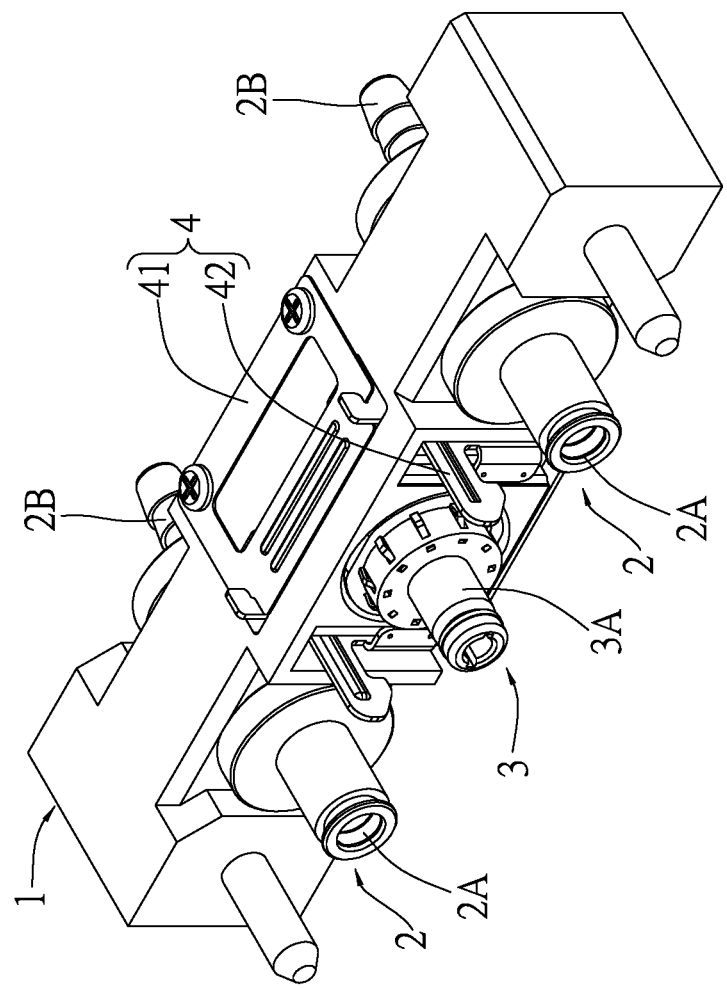
FIG. 7 shows a perspective, assembled, schematic view of the external connection head module according to the instant disclosure.
Figure 8:
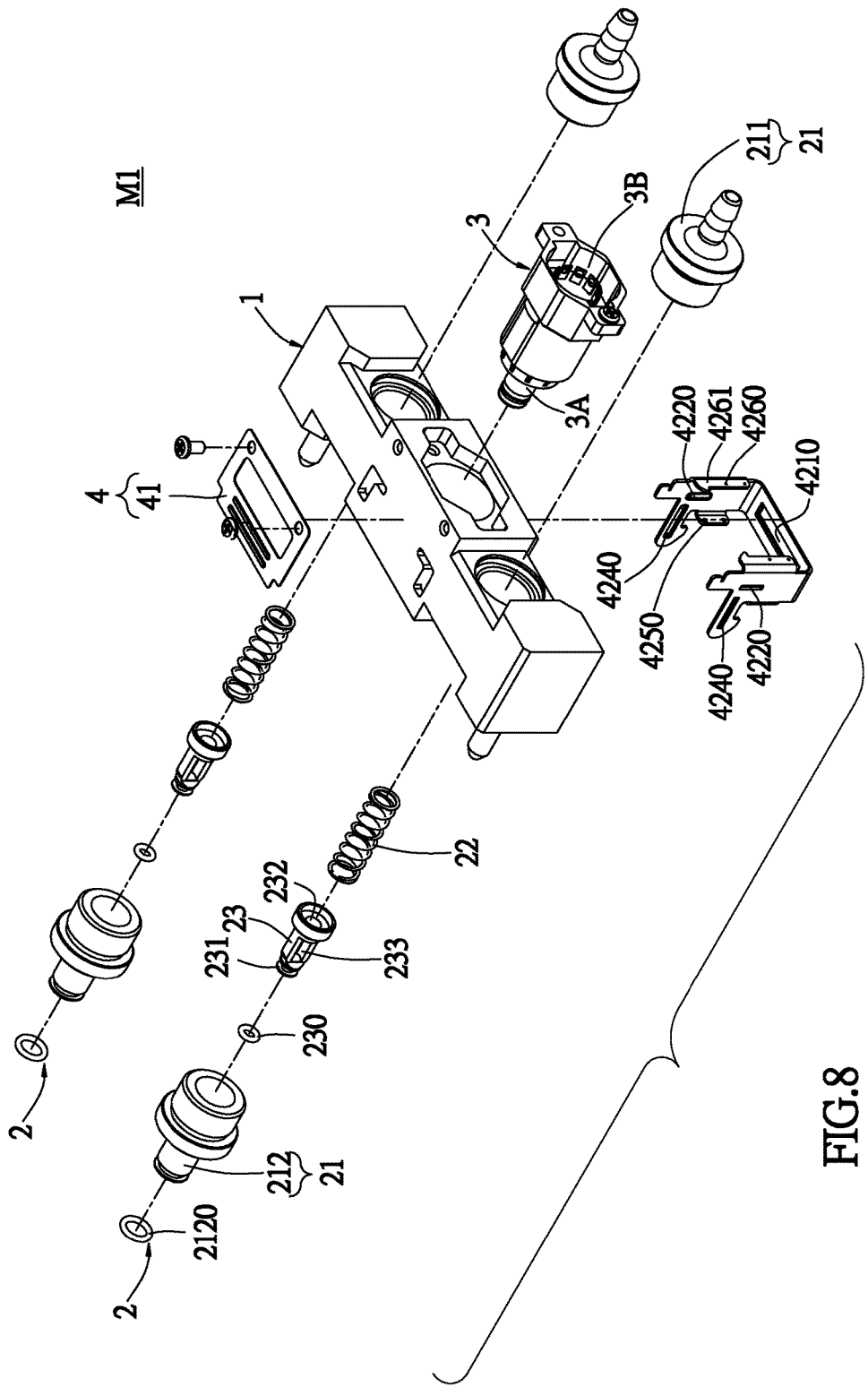
FIG. 8 shows another perspective, exploded, schematic view of the external connection head module according to the instant disclosure.
Figure 9:
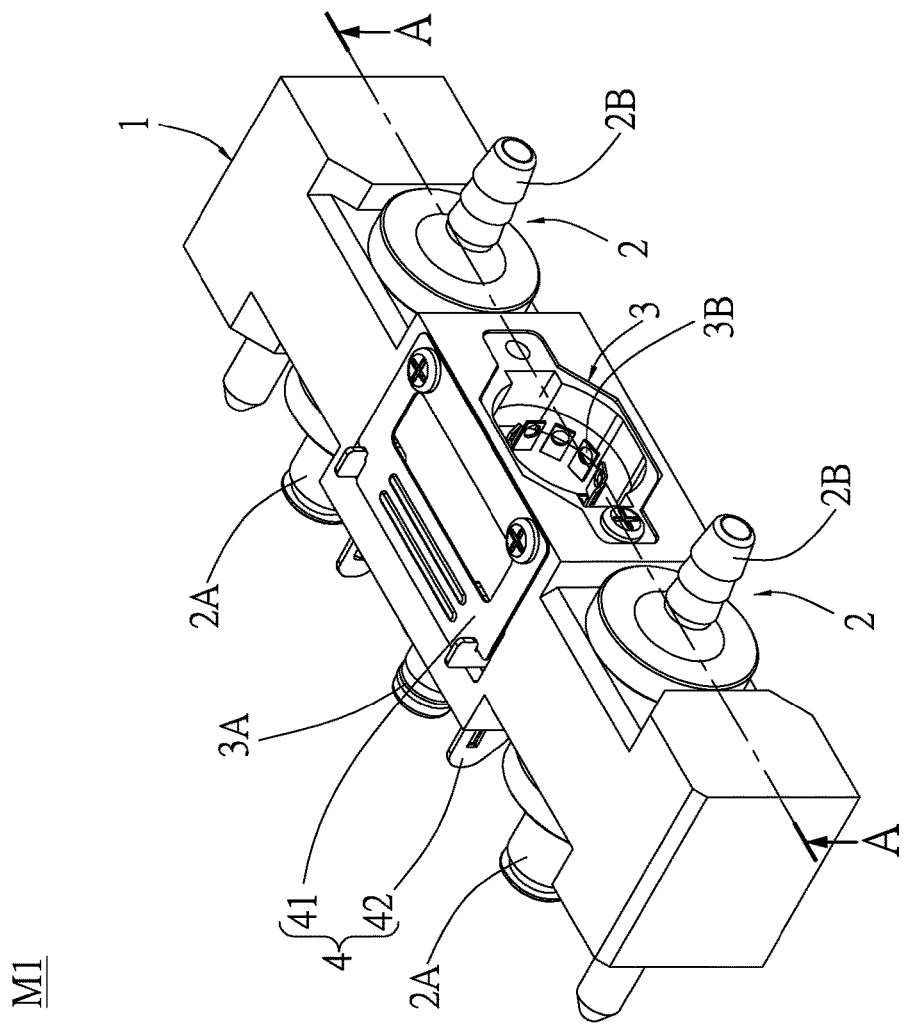
FIG. 9 shows another perspective, assembled, schematic view of the external connection head module according to the instant disclosure.
Figure 10:
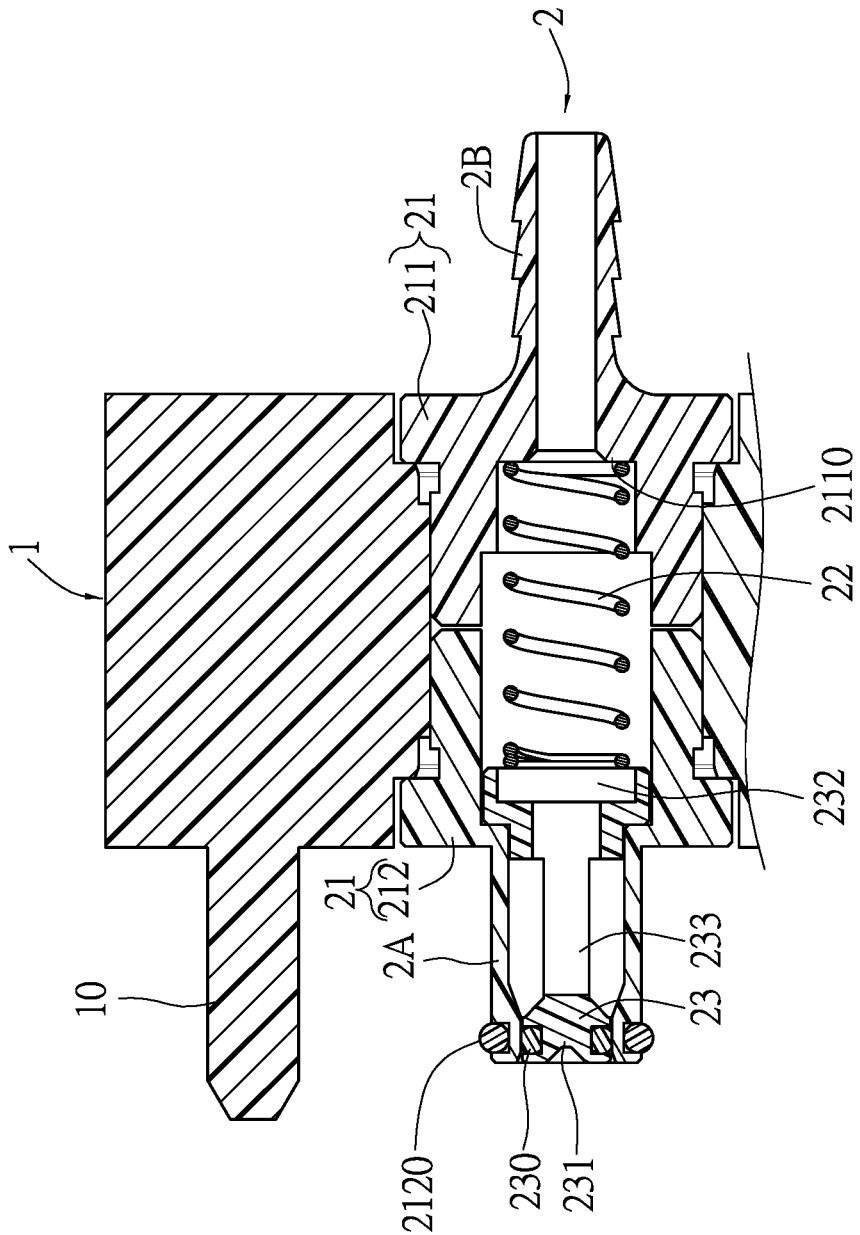
FIG. 10 shows a cross-sectional view taken along the section line A-A of FIG. 9.
Figure 11:
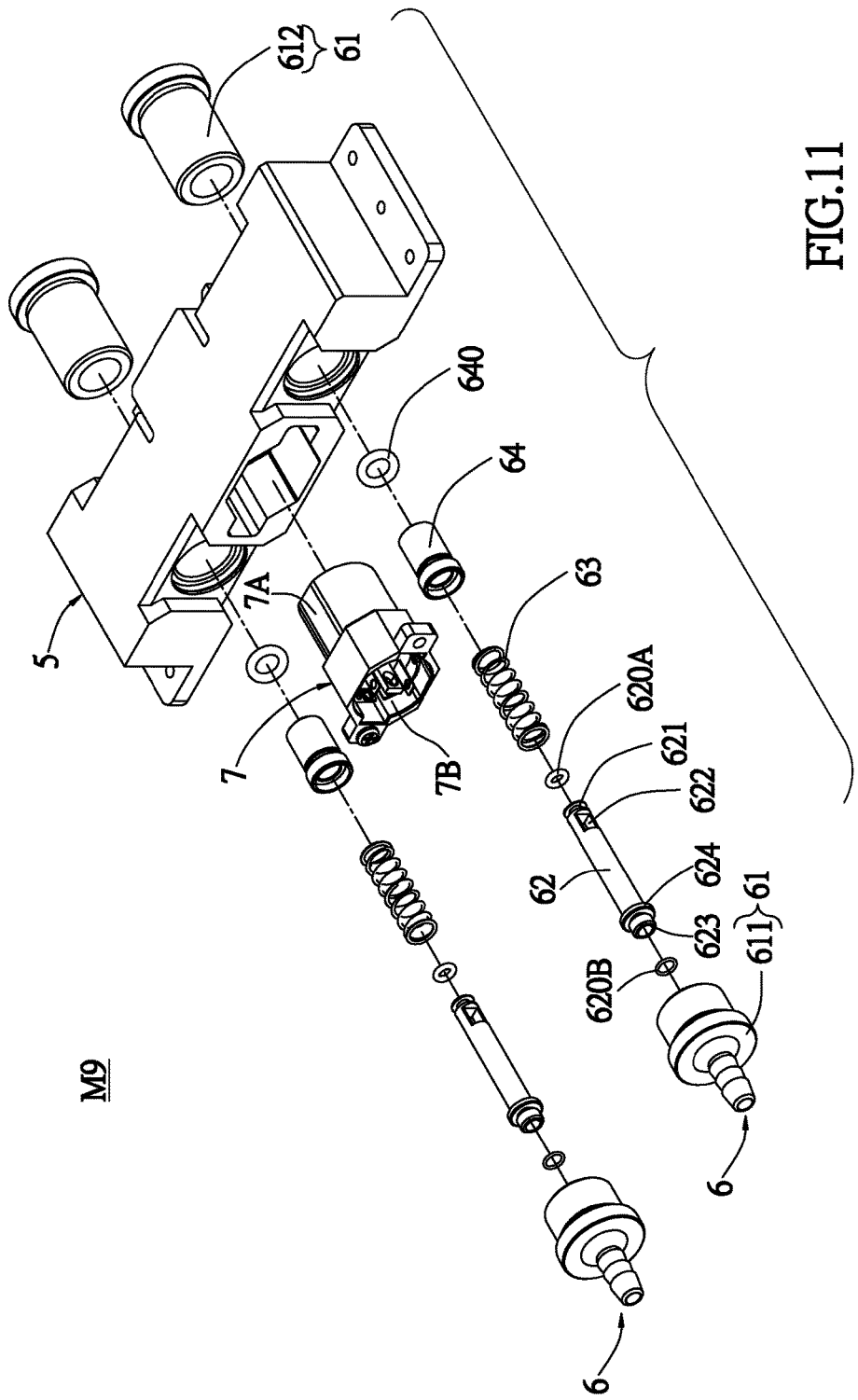
FIG. 11 shows a perspective, exploded, schematic view of the internal connection head module according to the instant disclosure.
Figure 12:
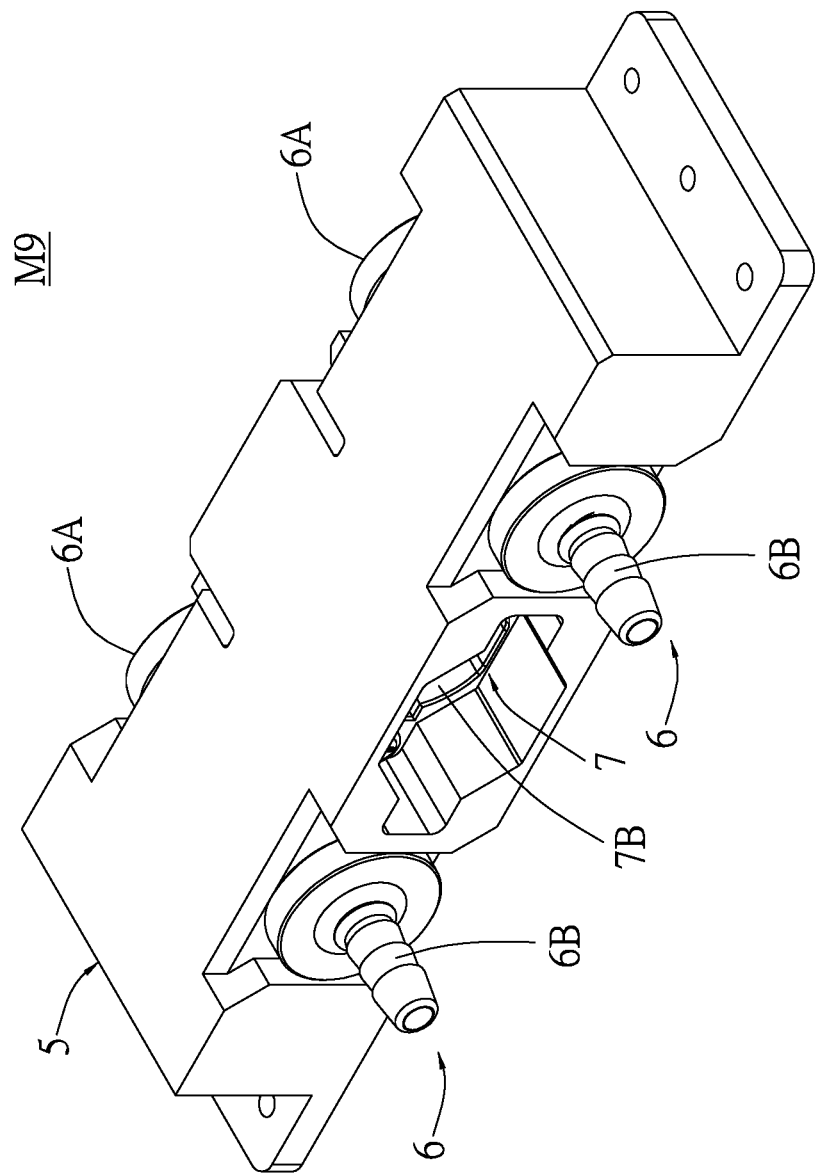
FIG. 12 shows a perspective, assembled, schematic view of the internal connection head module according to the instant disclosure.
Figure 13:
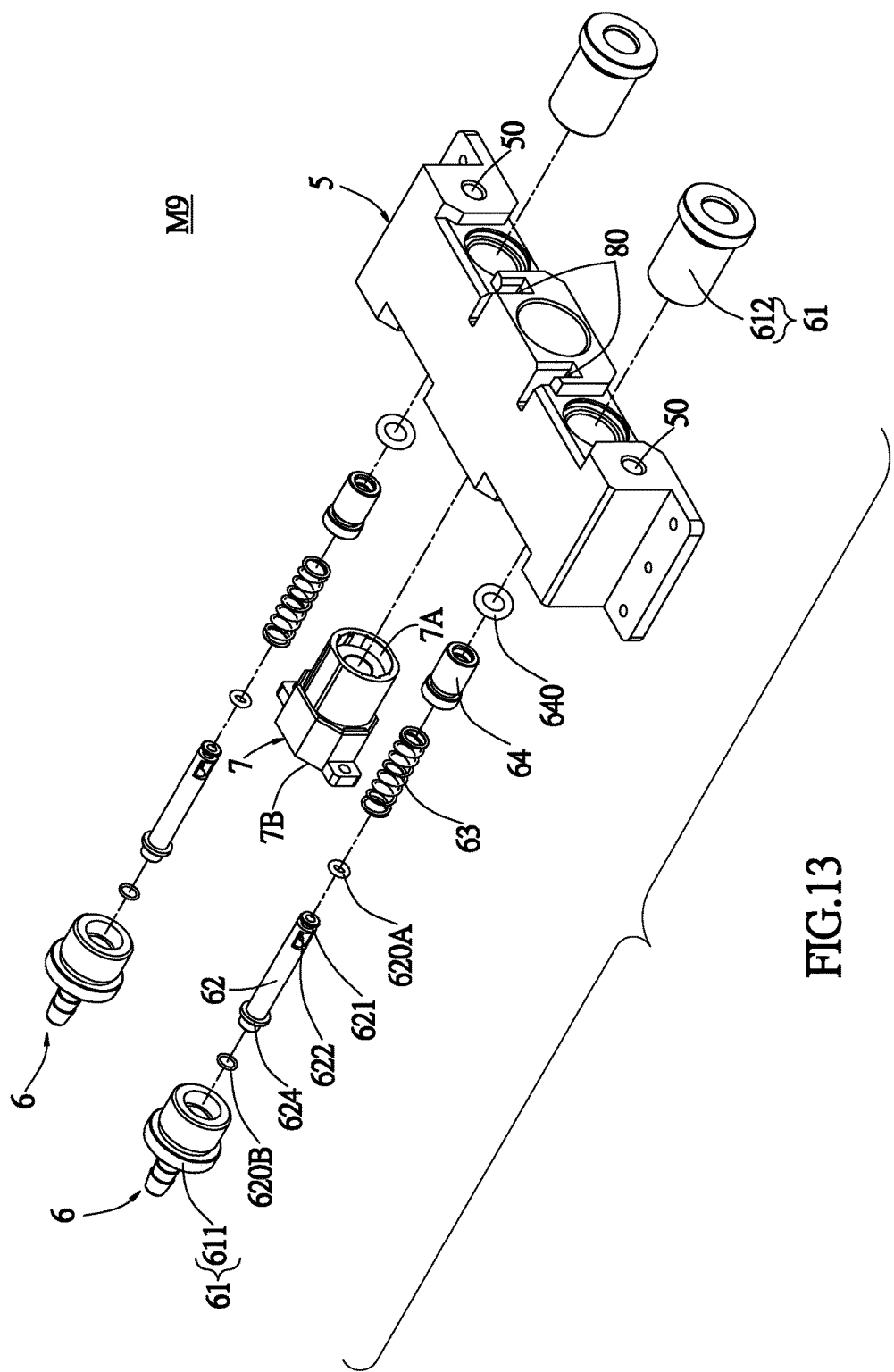
FIG. 13 shows another perspective, exploded, schematic view of the internal connection head module according to the instant disclosure.
Figure 14:
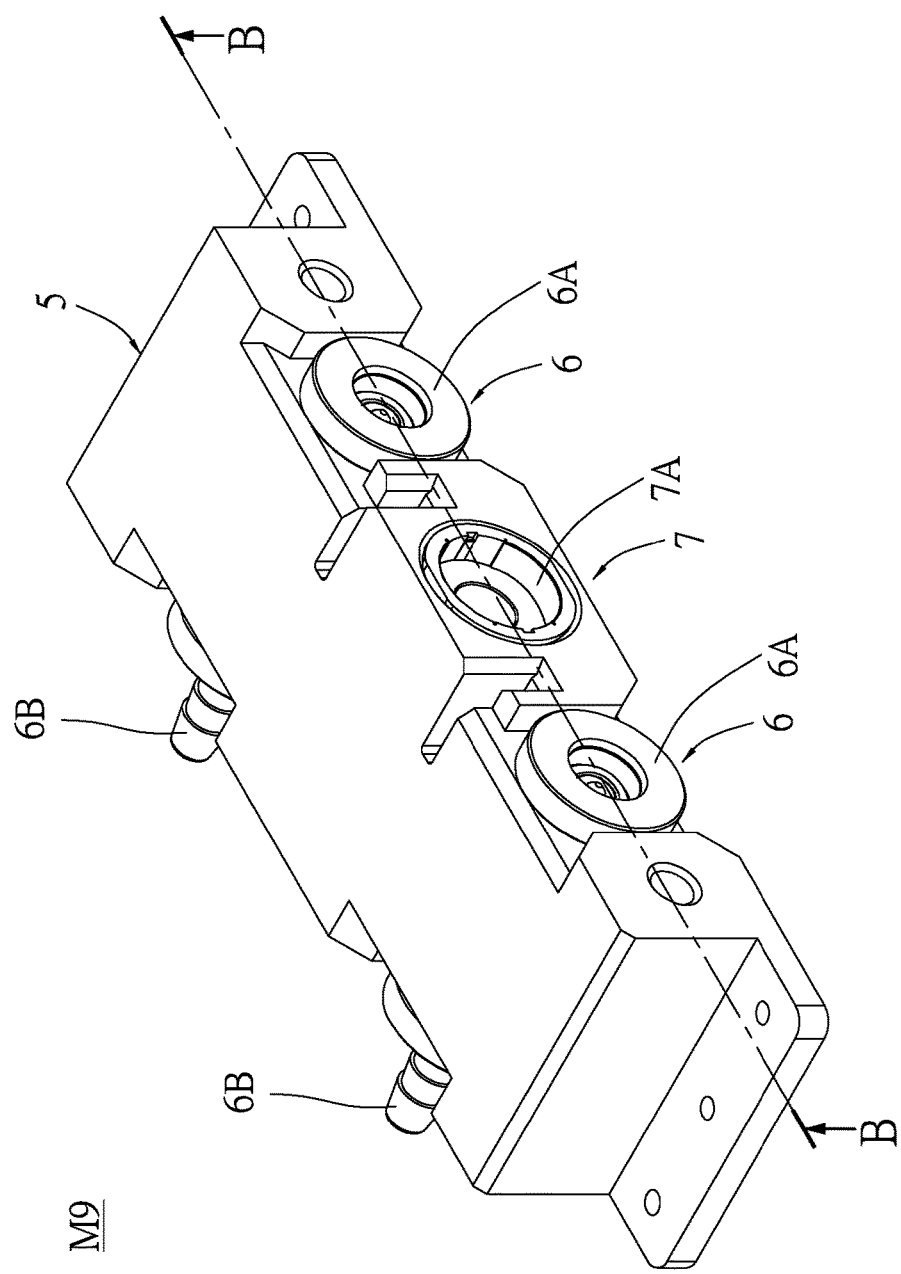
FIG. 14 shows another perspective, assembled, schematic view of the internal connection head module according to the instant disclosure.
Figure 15:
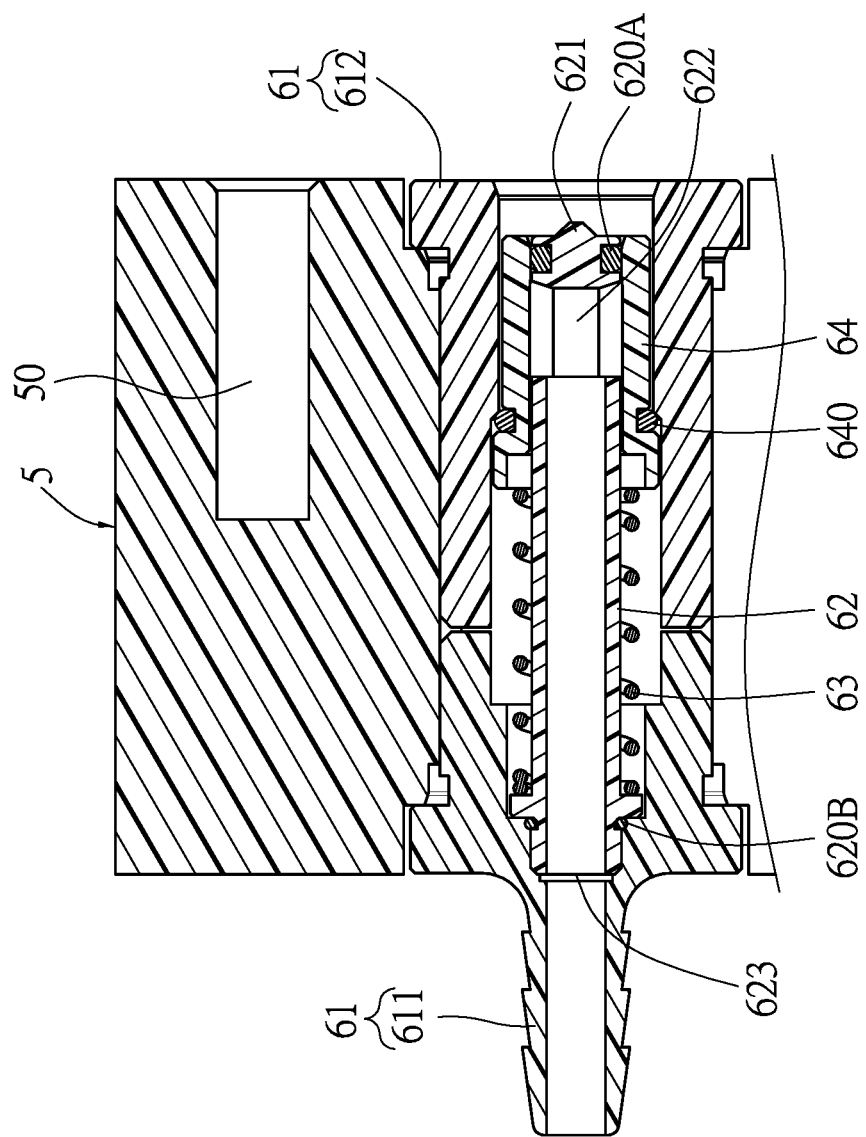
FIG. 15 shows a cross-sectional view taken along the section line B-B of FIG. 14.

More particularly, referring to FIG. 1, FIG. 4, and FIG. 5, the external auxiliary heat dissipation device D further comprises a carrier module M8, and the carrier module M8 includes a fixed carrier body M81, a slidable element M82 slidably disposed on the fixed carrier body M81 for carrying the external connection head module M1, a movable element M83 pivotally disposed on the fixed carrier body M81, and a connection element M84 pivotally connected between the slidable element M82 and the movable element M83. Moreover, as shown in FIG. 4, when the movable element M83 is moved downwardly (shown as the downward arrow), the slidable element M82 is moved backwardly (shown as the backward arrow) by matching the movable element M83 and the connection element M84, such that the external connection head module M1 is concurrently moved backwardly and separated from the internal connection head module M9 by following the backward movement of the slidable element M82.

As shown in FIG. 5, when the movable element M83 is moved upwardly (shown as the upwardly arrow), the slidable element M82 is moved frontward (shown as the frontward arrow) by matching the movable element M83 and the connection element M84, such that the external connection head module M1 is concurrently moved frontward and matched with the internal connection head module M9 by following the frontward movement of the slidable element M82.

Please note, the external connection head module M1, the fluid driving module M2, the heat dissipation module M3, the fluid supply module M4, the power supply module M5, the light-emitting module M7, and the carrier module M8 are disposed inside the casing module M6.

Referring to FIG. 6 to FIG. 20, the external connection head module M1 and the internal connection head module M9 are combined and mated with each other to form a multifunction integrated connection head assembly structure, and the multifunction integrated connection head assembly structure may be used as a quick-release connector assembly for integrating fluid channels with conductive channels.

First, referring to FIG. 6 to FIG. 10, and FIG. 16 to FIG. 18, the external connection head module M1 includes a first carrier body 1, at least two first fluid connectors 2 disposed on (such as passing through) the first carrier body 1, a first power connector 3 passing through the first carrier body 1, and a first retaining body 4 disposed on the first carrier body 1. More particularly, each first fluid connector 2 has a first inside connection portion 2A and a first outside connection portion 2B opposite to the first inside connection portion 2A and connected to a first external joint pipe P1 (such as a flexible hose), and the first power connector 3 includes a first inside conductive connection portion 3A and a first outside conductive connection portion 3B opposite to the first inside conductive connection portion 3A and electrically connected to a first external conductive wire C1.

For example, the first carrier body 1 has at least two first positioning portions 10. Each first fluid connector 2 includes a first assembling pipe body 21 disposed on (such as passing through) the first carrier body 1, a first elastic element 22 (such as a spring) disposed inside the first assembling pipe body 21, and a first movable element 23 movably disposed inside the first assembling pipe body 21 and abutted against the first elastic element 22. More particularly, the first assembling pipe body 21 includes a first outside pipe body 211 connected to the first external joint pipe P1 and a first inside pipe body 212 connected with the first outside pipe body 211. The first outside connection portion 2B is disposed on the first outside pipe body 211 and exposed outside the first carrier body 1, the first inside connection portion 2A is disposed on the first inside pipe body 212 and exposed outside the first carrier body 1, and the first inside pipe body 212 has a first sealing ring 2120 disposed around the first inside connection portion 2A. In addition, the first elastic element 22 is connected between an inner wall surface 2110 of the first outside pipe body 211 and the first movable element 23. Furthermore, the first movable element 23 has a first abutting portion 231, at least one first water inlet 232 communicated with (in fluid communication with) the first inside pipe body 212, and at least one first water outlet 233 communicated with the at least one first water inlet 232, and the first movable element 23 a second sealing ring 230 disposed therearound.

Moreover, referring to FIG. 11 to FIG. 15, and FIG. 16 to FIG. 18, the internal connection head module M9 is detachably connected with the external connection head module M1. The internal connection head module M9 includes a second carrier body 5 detachably connected with the first carrier body 1, at least two second fluid connectors 6 disposed on (such as passing through) the second carrier body 5 and respectively detachably connected with the at least two first fluid connectors 2, a second power connector 7 disposed on (such as passing through) the second carrier body 5 and detachably electrically connected with the first power connector 3, and a second retaining body 8 disposed on the second carrier body 5 and detachably mated with the first retaining body 4. More particularly, each second fluid connector 6 has a second inside connection portion 6A connected with the corresponding the first inside connection portion 2A and a second outside connection portion 6B opposite to the second inside connection portion 6A and connected to a second external joint pipe P2 (such as a flexible hose), and the second power connector 7 includes a second inside conductive connection portion 7A and electrically connected with the first inside conductive connection portion 3A and a second outside conductive connection portion 7B opposite to the second inside conductive connection portion 7A and electrically connected to a second external conductive wire C2.

For example, the second carrier body 5 has at least two second positioning portions 50 for respectively receiving the at least two first positioning portions 10. Each second fluid connector 6 includes a second assembling pipe body 61 disposed on (such as passing through) the second carrier body 5, an embedded pipe body 62 positioned inside the second assembling pipe body 61, a second elastic element 63 disposed around the embedded pipe body 62, and a second movable element 64 movably disposed around the embedded pipe body 62 and abutted against the second elastic element 63. More particularly, the second assembling pipe body 61 includes a second outside pipe body 611 connected to the second external joint pipe P2 and a second inside pipe body 612 connected with the second outside pipe body 611. The second outside connection portion 6B is disposed on the second outside pipe body 611 and exposed outside the second carrier body 5, the second inside connection portion 6A is disposed inside the second inside pipe body 612 for receiving the first inside connection portion 2A. In addition, the embedded pipe body 62 has a second abutting portion 621 abutted against the first abutting portion 231, at least one second water inlet 622 communicated with the second inside pipe body 612, and at least one second water outlet 623 communicated with the second outside pipe body 611, and the embedded pipe body 62 has a third sealing ring 620A and a fourth sealing ring 620B both disposed therearound. Furthermore, the second elastic element 63 is connected between an annular portion 624 of the embedded pipe body 62 and the second movable element 64. Moreover, the second movable element 64 is slidably disposed inside the embedded pipe body 62, such that the at least one second water inlet 622 can be opened or closed by moving the second movable element 64, and the second movable element 64 has a fifth sealing ring 640 disposed therearound.

More particularly, referring to FIG. 6, FIG. 8, FIG. 13, and FIG. 16 to FIG. 20, the first retaining body 4 includes an elastic member 41 (such as a elastic piece) disposed on a top side of the first carrier body 1 and a pressing member 42 detachably connected with the elastic member 41. The elastic member 41 has a fixing portion 411 fixedly disposed on the top side of the first carrier body 1, at least two elastic arms 412 extended from the fixing portion 411, and a movable portion 413 connected with the at least two elastic arms 412. In addition, the pressing member 42 has a pressing portion 421 disposed under a bottom side of the first carrier body 1 and separated from the first carrier body 1 by a predetermined distance, two extending portions 422 respectively upwardly extended from two opposite lateral sides of the pressing portion 421 and inserted into the first carrier body 1, two clamping portions 423 respectively upwardly extended from the two extending portions 422 for clamping the movable portion 413, two hook portions 424 respectively forwardly extended from the two extending portions 422, two first sliding portions 425 respectively inwardly extended from the two extending portions 422, and two second sliding portions 426 respectively inwardly extended from the two extending portions 422. Moreover, the second retaining body 8 has two hook grooves 80 for respectively receiving the two hook portions 424. Please note, when a user press the pressing portion 421 of the pressing member 42, the two hook portions 424 are respectively separated from the two hook grooves 80, so as to separate the external connection head module M1 from the internal connection head module M9 by elastic forces provided by both the first elastic element 22 and the second elastic element 63.

For example, the elastic member 41 has at least one first reinforcement rib 4130 disposed on the movable portion 413, and the pressing member 42 has at least one second reinforcement rib 4210 disposed on the pressing portion 421, at least two third reinforcement ribs 4220 respectively disposed on the two extending portions 422, and at least two fourth reinforcement ribs 4240 respectively disposed on the two hook portions 424. In addition, the first carrier body 1 has two first sliding tracks 101 for respectively receiving the two first sliding portions 425, two second sliding tracks 102 for respectively receiving the two second sliding portions 426, and two position-limiting bumps 103 (such as convex blocks) respectively adjacent to the two second sliding tracks 102. Moreover, each first sliding portion 425 has a plurality of first contact convex points 4250 contacting the corresponding first sliding track 101, and each second sliding portion 426 has a plurality of second contact convex points 4260 contacting the corresponding second sliding track 102 and a position-limiting hook 4261 contacting the corresponding position-limiting bump 103.

Figure 16:
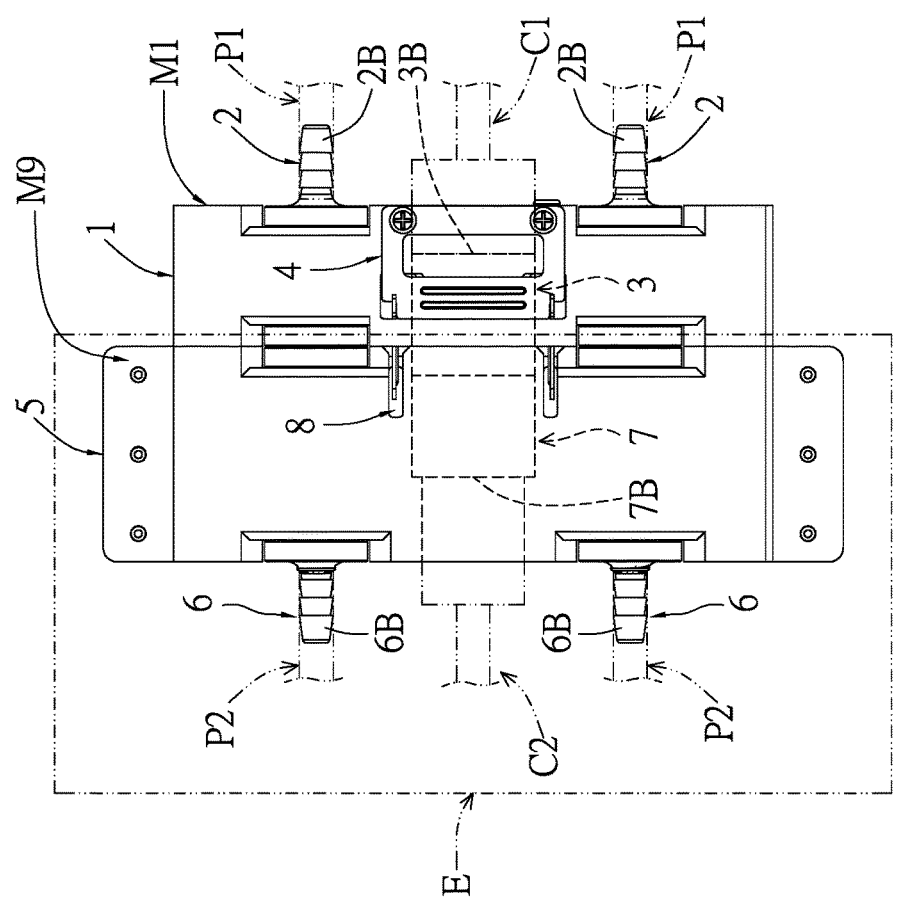
FIG. 16 shows a top, assembled, schematic view of the electronic system and the external auxiliary heat dissipation device thereof according to the instant disclosure.
Figure 17:
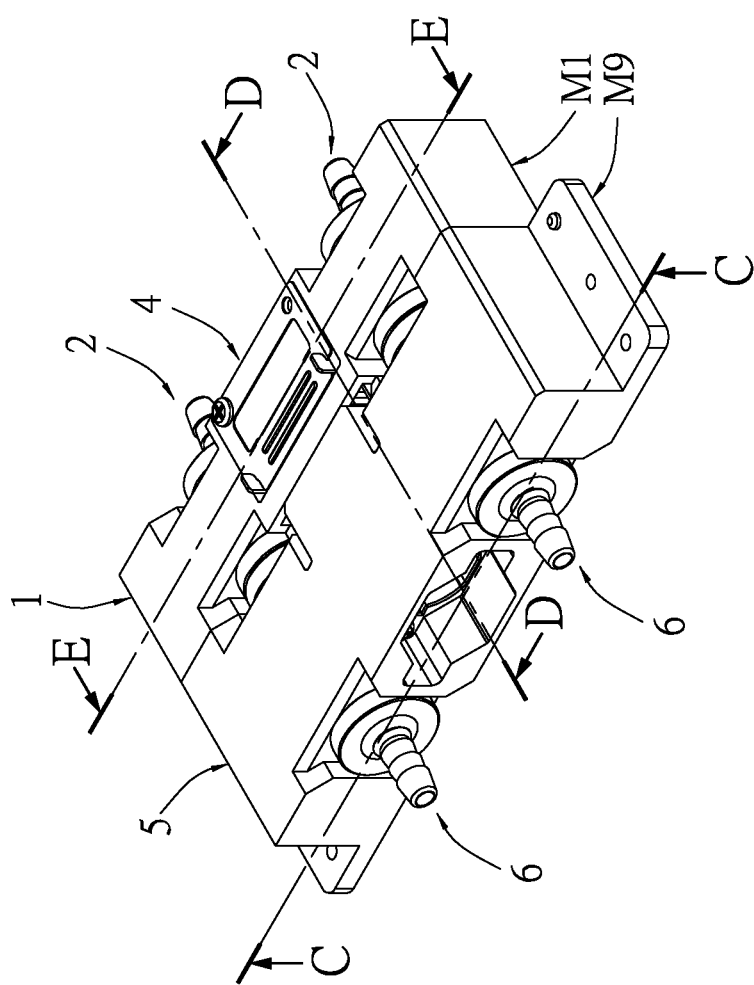
FIG. 17 shows a perspective, assembled, schematic view of the multifunction integrated connection head assembly structure according to the instant disclosure.
Figure 18:
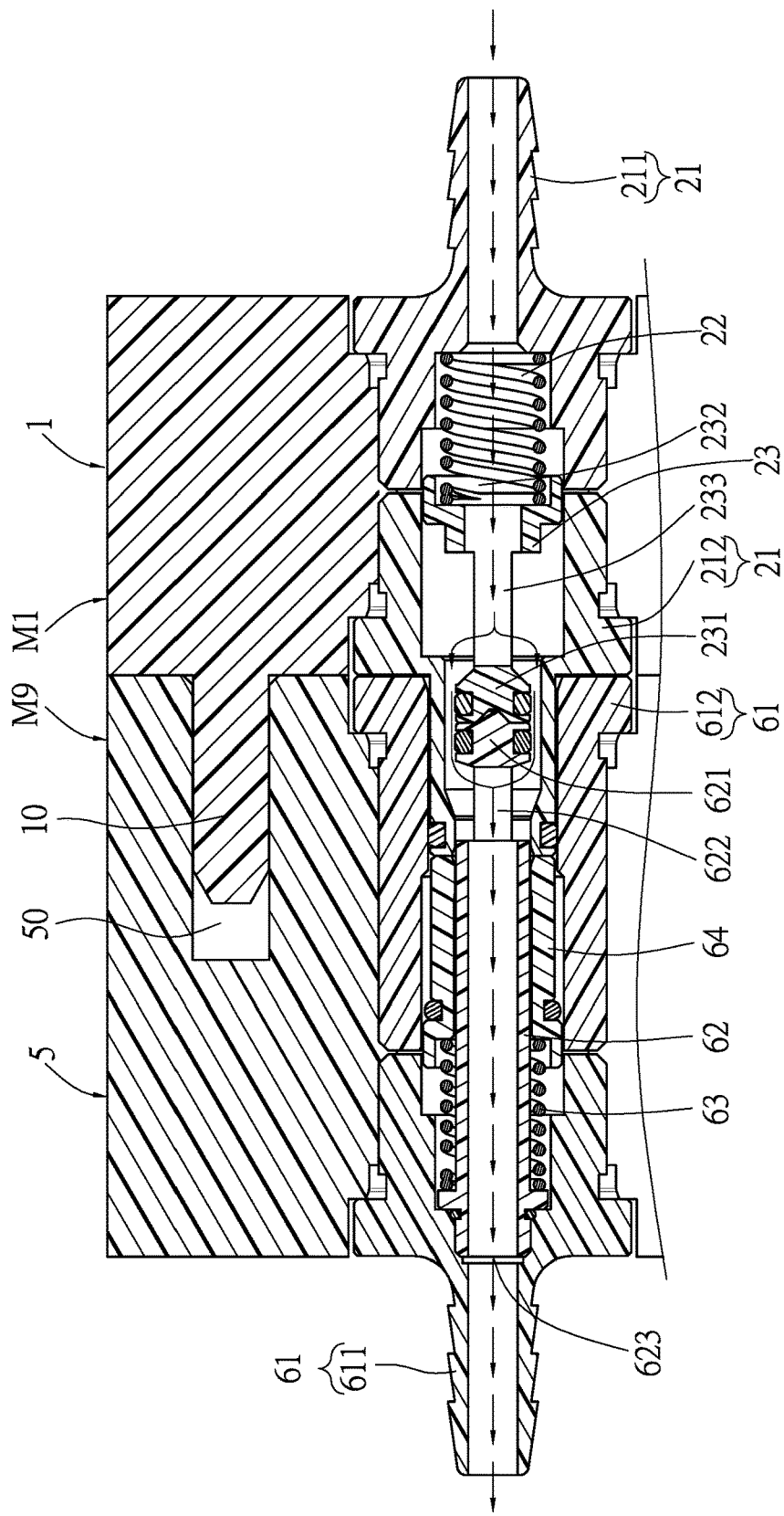
FIG. 18 shows a cross-sectional view taken along the section line C-C of FIG. 17.
Figure 19:
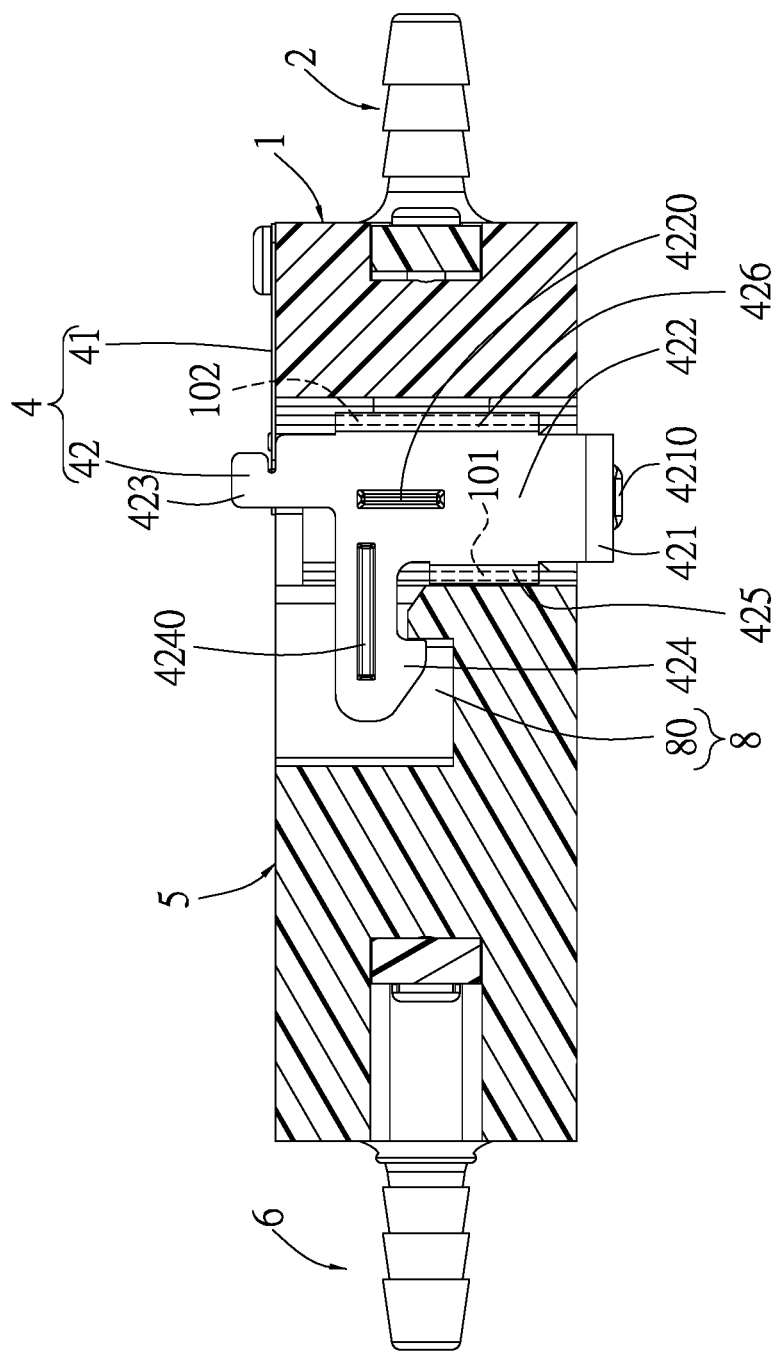
FIG. 19 shows a cross-sectional view taken along the section line D-D of FIG. 17.
Figure 20:
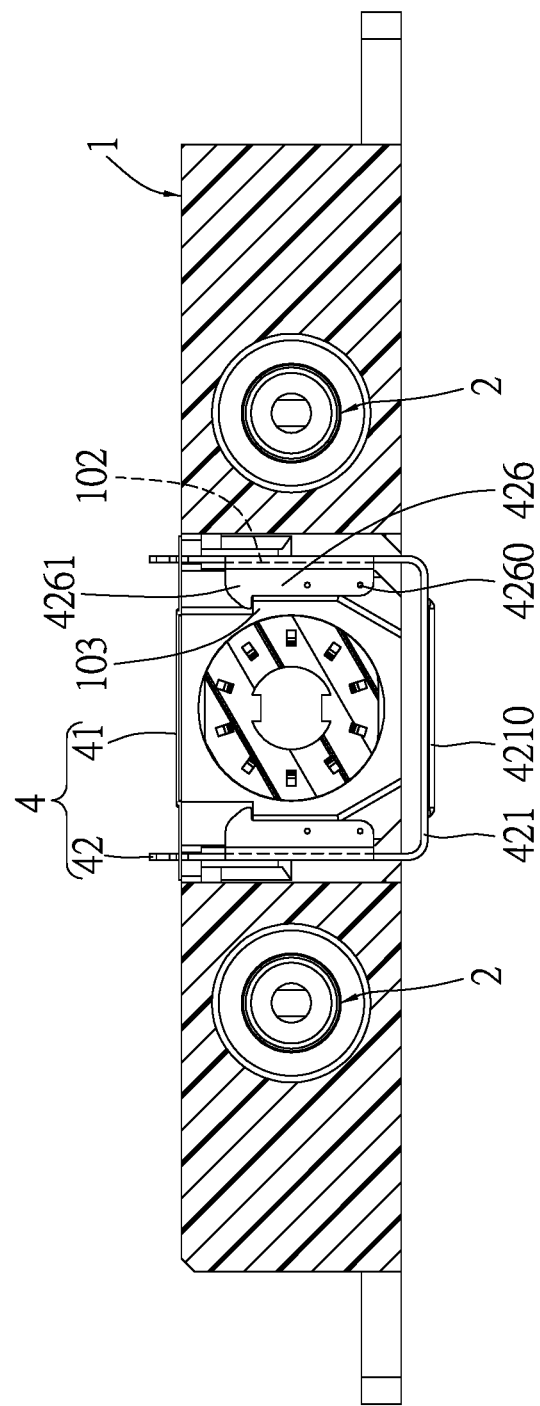
FIG. 20 shows a cross-sectional view taken along the section line E-E of FIG. 17.

Furthermore, as shown in FIG. 16, the multifunction integrated connection head assembly structure can be applied to any electronic device E such as a computer host, in which the internal connection head module M9 is disposed inside the electronic device E, and the external connection head module M1 is disposed out of the electronic device E. Please note, the electronic device E can be replaced by any type of heat-dissipating carrier. For example, the heat-dissipating carrier may be a heat-dissipating plate, and the internal connection head module M9 is fixed on the heat-dissipating plate.

In conclusion, when the internal connection head module M9 is detachably connected to the external connection head module M1, the first fluid pathway and the second fluid pathway are in fluid communication with each other to form a loop fluid pathway due to the design of "the first pipes T1 being connected to the first fluid connector 2, the fluid driving module M2, and the heat dissipation module M3 to form a first fluid pathway" and "the second pipes T2 being connected to the internal connection head module M9 to form a second fluid pathway".

Please note, the at least two first fluid connectors 2 are respectively in fluid communication with the at least two second fluid connector 6 due to the designs of "each first fluid connector 2 having a first inside connection portion 2A and a first outside connection portion 2B opposite to the first inside connection portion 2A and connected to a first external joint pipe P1" and "each second fluid connector 6 having a second inside connection portion 6A connected with the corresponding the first inside connection portion 2A and a second outside connection portion 6B opposite to the second inside connection portion 6A and connected to a second external joint pipe P2". In addition, the first power connector 3 is in electrical communication with the second power connector 7 due to the designs of "the first power connector 3 including a first inside conductive connection portion 3A and a first outside conductive connection portion 3B opposite to the first inside conductive connection portion 3A and electrically connected to a first external conductive wire C1" and "the second power connector 7 including a second inside conductive connection portion 7A and electrically connected with the first inside conductive connection portion 3A and a second outside conductive connection portion 7B opposite to the second inside conductive connection portion 7A and electrically connected to a second external conductive wire C2". Thus, the fluid communication (fluid channels) and the electrical communication (conductive channels) are integrally applied to the same the external auxiliary heat dissipation device D.

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. An electronic system, comprising:
   an external auxiliary heat dissipation device, comprising:
   an external connection head module including a first carrier body and at least two first fluid connectors disposed on the first carrier body; at least one of the two first fluid connectors including:
   a first assembling pipe body passing through the first carrier body;
   a first elastic element disposed inside the first assembling pipe body; and
   a first movable element movably disposed inside the first assembling pipe body and abutted against the first elastic element;
   a fluid driving module;
   a heat dissipation module; and
   a plurality of first pipes connected to the first fluid connectors, the fluid driving module, and the heat dissipation module to form a first fluid pathway; and
   an electronic device including an internal connection head module and a plurality of second pipes, wherein the second pipes are connected to the internal connection head module to form a second fluid pathway, and the internal connection head module is detachably connected to the external connection head module, so that the first fluid pathway and the second fluid pathway are in fluid communication with each other to form a loop fluid pathway.

2. The electronic system of claim 1, wherein the external connection head module includes a first power connector disposed on the first carrier body, and at least one first retaining body disposed on the first carrier body.

3. The electronic system of claim 2, wherein the at least one first retaining body includes an elastic member disposed on a top side of the first carrier body and a pressing member detachably connected with the elastic member, the elastic member has a fixing portion fixedly disposed on the top side of the first carrier body, at least two elastic arms extended from the fixing portion, and a movable portion connected with the at least two elastic arms, and the pressing member has a pressing portion disposed under a bottom side of the first carrier body and separated from the first carrier body by a predetermined distance, two extending portions respectively upwardly extended from two opposite lateral sides of the pressing portion and inserted into the first carrier body, two clamping portions respectively upwardly extended from the two extending portions for clamping the movable portion, two hook portions respectively forwardly extended from the two extending portions, two first sliding portions respectively inwardly extended from the two extending portions, and two second sliding portions respectively inwardly extended from the two extending portions.

4. The electronic system of claim 3, wherein the elastic member has at least one first reinforcement rib disposed on the movable portion, and the pressing member has at least one second reinforcement rib disposed on the pressing portion, at least two third reinforcement ribs respectively disposed on the two extending portions, and at least two fourth reinforcement ribs respectively disposed on the two hook portions, wherein the first carrier body has two first sliding tracks for respectively receiving the two first sliding portions, two second sliding tracks for respectively receiving the two second sliding portions, and two position-limiting bumps respectively adjacent to the two second sliding tracks, each first sliding portion has a plurality of first contact convex points contacting the corresponding first sliding track, and each second sliding portion has a plurality of second contact convex points contacting the corresponding second sliding track and a position-limiting hook contacting the corresponding position-limiting bump.

5. The electronic system of claim 1, wherein the external auxiliary heat dissipation device comprises a fluid supply module, and the fluid supply module includes a replaceable fluid supply cartridge and a quick-release connector in fluid communication with the replaceable fluid supply cartridge, wherein the heat dissipation module includes a first water-cooling heat dissipation structure in fluid communication with one of the two first fluid connectors and a second water-cooling heat dissipation structure in fluid communication with the first water-cooling heat dissipation structure, and the first water-cooling heat dissipation structure and the second water-cooling heat dissipation structure are symmetrically arranged relative to the fluid driving module, wherein the fluid driving module includes an outer casing and a pump disposed inside the outer casing, and the outer casing has a first water inlet in fluid communication with the second water-cooling heat dissipation structure, a second water inlet in fluid communication with the quick-release connector, and a water outlet in fluid communication with another one of the two first fluid connectors.

6. The electronic system of claim 2, wherein the external auxiliary heat dissipation device comprises a power supply module electrically connected to the first power connector.

7. The electronic system of claim 1, wherein the external auxiliary heat dissipation device comprises a casing module, the casing module has a transparent viewing window, and the external connection head module, the fluid driving module, and the heat dissipation module are disposed inside the casing module.

8. The electronic system of claim 7, wherein the external auxiliary heat dissipation device comprises a light-emitting module disposed on the heat dissipation module, and light beams generated by the light-emitting module pass through the transparent viewing window and go away from the transparent viewing window.

9. The electronic system of claim 1, wherein the external auxiliary heat dissipation device comprises a carrier module, and the carrier module includes a fixed carrier body, a slidable element slidably disposed on the fixed carrier body for carrying the external connection head module, a movable element pivotally disposed on the fixed carrier body, and a connection element pivotally connected between the slidable element and the movable element.

10. An external auxiliary heat dissipation device, comprising:
    an external connection head module including a first carrier body and at least two first fluid connectors disposed on the first carrier body; at least one of the two first fluid connectors including:
    a first assembling pipe body passing through the first carrier body;
    a first elastic element disposed inside the first assembling pipe body; and
    a first movable element movably disposed inside the first assembling pipe body and abutted against the first elastic element;
    a fluid driving module;
    a heat dissipation module; and
    a plurality of first pipes connected to the first fluid connectors, the fluid driving module, and the heat dissipation module to form a first fluid pathway.

11. The external auxiliary heat dissipation device of claim 10, wherein the external connection head module includes a first power connector disposed on the first carrier body, and at least one first retaining body disposed on the first carrier body.

12. The external auxiliary heat dissipation device of claim 10, wherein the external auxiliary heat dissipation device comprises a fluid supply module, and the fluid supply module includes a replaceable fluid supply cartridge and a quick-release connector in fluid communication with the replaceable fluid supply cartridge, wherein the heat dissipation module includes a first water-cooling heat dissipation structure in fluid communication with one of the two first fluid connectors and a second water-cooling heat dissipation structure in fluid communication with the first water-cooling heat dissipation structure, and the first water-cooling heat dissipation structure and the second water-cooling heat dissipation structure are symmetrically arranged relative to the fluid driving module, wherein the fluid driving module includes an outer casing and a pump disposed inside the outer casing, and the outer casing has a first water inlet in fluid communication with the second water-cooling heat dissipation structure, a second water inlet in fluid communication with the quick-release connector, and a water outlet in fluid communication with another one of the two first fluid connectors.

13. The external auxiliary heat dissipation device of claim 11, wherein the external auxiliary heat dissipation device comprises a power supply module electrically connected to the first power connector.

14. The external auxiliary heat dissipation device of claim 10, wherein the external auxiliary heat dissipation device comprises a casing module, the casing module has a transparent viewing window, and the external connection head module, the fluid driving module, and the heat dissipation module are disposed inside the casing module.

15. The external auxiliary heat dissipation device of claim 14, wherein the external auxiliary heat dissipation device comprises a light-emitting module disposed on the heat dissipation module, and light beams generated by the light-emitting module pass through the transparent viewing window and go away from the transparent viewing window.

16. The external auxiliary heat dissipation device of claim 10, wherein the external auxiliary heat dissipation device comprises a carrier module, and the carrier module includes a fixed carrier body, a slidable element slidably disposed on the fixed carrier body for carrying the external connection head module, a movable element pivotally disposed on the fixed carrier body, and a connection element pivotally connected between the slidable element and the movable element.

* * * * *